United States Patent
Lee et al.

(10) Patent No.: US 7,281,328 B2
(45) Date of Patent: Oct. 16, 2007

(54) METHOD OF FABRICATING RIGID-FLEXIBLE PRINTED CIRCUIT BOARD

(75) Inventors: Yang Je Lee, Chungcheongbuk-do (KR); Dek Gin Yang, Chungcheongbuk-do (KR); Jung Wook Hwang, Gyeongsangnam-do (KR); Kyu Hyok Yim, Chungcheongbuk-do (KR); Jung Hun Chai, Jeollabuk-do (KR); Young Ho Lee, Daegu (KR); Kwang Yune Kim, Daejeon (KR); Dong Gi An, Chungcheongnam-do (KR)

(73) Assignee: Samsung Electro-Mechanics Co., Ltd., Kyunggi-Do (KR)

( * ) Notice: Subject to any disclaimer, the term of this patent is extended or adjusted under 35 U.S.C. 154(b) by 0 days.

(21) Appl. No.: 11/253,973

(22) Filed: Oct. 18, 2005

(65) Prior Publication Data

US 2006/0101640 A1 May 18, 2006

(30) Foreign Application Priority Data

Oct. 28, 2004 (KR) ............... 10-2004-0086731

(51) Int. Cl.
*H01K 3/10* (2006.01)
(52) U.S. Cl. ............ 29/852; 29/846; 29/847; 174/254; 174/262; 427/97.1; 427/97.7

(58) Field of Classification Search ............ 29/846, 29/847, 852; 174/262, 254, 255; 427/97.1, 427/97.7
See application file for complete search history.

(56) References Cited

U.S. PATENT DOCUMENTS

| 5,095,628 | A | * | 3/1992 | McKenney et al. | ........... 29/846 |
| 5,206,463 | A | * | 4/1993 | DeMaso et al. | ............ 174/254 |
| 6,745,463 | B1 | * | 6/2004 | Chou | ........................ 29/852 |

FOREIGN PATENT DOCUMENTS

JP  2003-101167 A  4/2003

* cited by examiner

*Primary Examiner*—Richard Chang
(74) *Attorney, Agent, or Firm*—Darby & Darby P.C.

(57) ABSTRACT

The present invention is related to a method of fabricating a rigid-flexible printed circuit board. Specifically, this invention relates to a method of fabricating a rigid-flexible printed circuit board, in which an internal circuit pattern exposed for use in an external pad and a mounting pad is protected from external environments using a resist cover by window etching the base copper foil of a flexible region upon formation of an external circuit pattern as opposed to using a resist cover. Thus the number of fabrication processes and the fabrication costs are decreased and the increase in defect rates due to contamination is prevented, resulting in maximized reliability.

5 Claims, 7 Drawing Sheets

METHOD OF FABRICATING RIGID-FLEXIBLE PRINTED CIRCUIT BOARD

INCORPORATION BY REFERENCE

The present application claims priority under 35 U.S.C. §119 to Korean Patent Application No. 10-2004-0086731 filed on Oct. 28, 2004. The content of the application is incorporated herein by reference in its entirety.

BACKGROUND OF THE INVENTION

1. Field of the Invention

The present invention relates, generally, to a method of fabricating a rigid-flexible printed circuit board (rigid-flexible PCB), and more particularly, to a method of fabricating a flying tail type rigid-flexible PCB that eliminates the need for a resist cover serving to protect a pad portion exposed for use in an external pad and a mounting pad from external environments, by window etching the base copper foil of a flexible region upon the formation of an external circuit pattern, instead of using the resist cover.

2. Description of the Related Art

Recently, while the degree of integration of semiconductor devices is gradually increasing, the number of pads provided on semiconductor devices to connect the semiconductor devices to external circuits is increasing and the mounting density is also increasing. For example, when a minimum processing dimension on the semiconductor device formed of silicon is about 0.2 µm, about 1000 pads may be provided on a semiconductor device having a size of about 10×10 mm.

Further, in semiconductor apparatuses, such as semiconductor packages, having the semiconductor devices mounted thereon, the size and thickness of the apparatus should be decreased to increase the mounting density. In particular, small and thin semiconductor packages are required for portable information apparatuses, such as notebook type PCs, PDAs, mobile phones, etc.

For packaging the semiconductor device, while the semiconductor device is mounted on a wiring substrate, the pad of the semiconductor device should be connected to the pad of the wiring substrate. However, in the case where about 1000 pads are provided on the about 10×10 mm sized semiconductor device, they come to have fine pitches of about 40 µm. Hence, with the aim of connecting the pad having the fine pitch of the semiconductor device to the pad of the wiring substrate, very high accuracy is required for wiring on the wiring substrate or position-matching upon connection. Eventually, it is difficult to apply conventional wire bonding techniques or tape automated bonding (TAB) techniques.

To solve the problem, the use of a rigid-flexible PCB having rigid and flexible regions interconnected without the use of an additional connector by structurally bonding a rigid substrate and a flexible substrate together is more and more frequently proposed. In particular, the rigid-flexible PCB is mainly applied to small terminals, such as mobile phones, realizing high integration by removing unnecessary space due to the use of the connector, depending on requirements of fine pitches and high integration of mounting parts in proportion to high functionality of the mobile apparatuses.

Although the rigid-flexible substrate is manufactured in the most commonly used rigid-flexible-rigid form or the rigid-flexible form, the present invention is directed to a flying tail type comprising only rigid-flexible regions.

Referring to FIGS. 1A to 1I, a conventional process of fabricating a flying tail type rigid-flexible PCB is sequentially shown.

In a polyimide copper clad laminate 10 including a polyimide layer 11 and a copper foil 12, the copper foil 12 is subjected to a photolithographic process to form an internal circuit pattern having a predetermined shape (FIG. 1A).

Then, to protect the internal circuit pattern corresponding to a flexible region, which is to be formed on the polyimide copper clad laminate 10, from the external environment, a polyimide film 20 is processed to suit the flexible region.

The processed polyimide film 20 is attached to the part of the flexible region having the corresponding internal circuit pattern, using an adhesive, after which the polyimide film 20 is temporarily bonded through manual soldering, thereby completing the process of forming a coverlay (FIG. 1B).

After the formation of the coverlay corresponding to the part of the flexible region using the polyimide film 20, a resist cover 30 is formed on the other part of the flexible region (FIG. 1C).

The resist cover 30 functions to protect the internal circuit pattern exposed for use in an external pad and a mounting pad from external environments, and includes, for example, heat-resistant tape or peelable ink. In addition, the resist cover 30 is removed after the completion of the substrate, unlike the polyimide film 20.

Subsequently, to confer mechanical strength and adhesive strength to a rigid region, which is to be formed on the polyimide copper clad laminate 10, prepregs 40 and base copper plates 50 are laminated on the upper and lower surfaces of the base substrate to face each other.

After the prepregs 40 and the base copper plates 50 are laminated, they are compressed using a press, to form both a rigid region, in which the circuit pattern is incorporated into the prepreg, and a flexible region, in which the circuit pattern is covered with the coverlay (FIG. 1D).

Then, a through hole 60 for electrical connection between internal and external layers is formed (FIG. 1E). The base copper plate 50 and the through hole 60 are plated with copper to form a copper plated layer 70 (FIG. 1F). During the plating, an external circuit pattern having a predetermined shape is formed (FIG. 1G).

The external circuit pattern is obtained using a predetermined photolithographic process, and the plated layer of the flexible region is etched therewith.

After the external circuit pattern having a predetermined shape is formed, the resist cover 30 is removed.

In the case where the resist cover is formed of peelable ink, peelable ink may be easily removed by further applying peelable ink on the formed peelable ink to form an ink layer having a predetermined thickness and then removing the ink layer (FIG. 1H).

Thereafter, the resultant substrate is coated with PSR ink (photo imageable solder resist mask ink) and then surface treated, thereby finally completing a flying tail type rigid-flexible PCB, in which the flexible region is covered with the coverlay, including the polyimide film and the resist cover (FIG. 1I).

However, in the flying tail type rigid-flexible PCB thus formed, since the external pad or mounting pad of the flexible region is internally exposed, processes of forming the resist cover on the flexible region using the heat-resistant tape or peelable ink and then removing it are required, causing problems of undesirably complicating fabrication processes and of increasing fabrication costs.

Further, due to the residue remaining after the removal of the heat-resistant tape or peelable ink, contamination may occur, thus a defect rate is increased, resulting in drastically decreased reliability.

SUMMARY OF THE INVENTION

Accordingly, the present invention has been made keeping in mind the above problems occurring in the related art, and an object of the present invention is to provide a method of fabricating a flying tail type rigid-flexible PCB, which is advantageous because a resist cover is not used and a base copper foil of a flexible region is window etched after the formation of an external circuit pattern, thereby decreasing the number of fabrication processes and the fabrication costs and preventing contamination, thus reducing a defect rate, resulting in maximized reliability.

In order to achieve the above object, the present invention provides a method of fabricating a flying tail type rigid-flexible PCB without the need for a resist cover, which includes the steps of providing a base substrate including a polyimide film having an internal circuit pattern formed on at least one surface thereof; forming a coverlay to protect the internal circuit pattern corresponding to a flexible region of the base substrate, with the exception of a pad portion of the flexible region; placing prepregs on upper and lower surfaces of the base substrate corresponding to a rigid region, placing base copper plates corresponding to the rigid region and the flexible region on the prepregs, and then collectively laminating the placed prepregs and base copper plates to form a rigid region and a flexible region; forming external circuit patterns electrically connected to each other on the rigid region, while protecting the base copper plate corresponding to the flexible region; and removing the base copper plate corresponding to the flexible region.

DETAILED DESCRIPTION OF THE INVENTION

Hereinafter, a detailed description will be given of a method of fabricating a rigid-flexible PCB, according to the present invention, with reference to the appended drawings.

FIGS. 2A to 2I are sectional views sequentially showing a process of fabricating a rigid-flexible PCB, according to the present invention.

Figure 1A:
FIGS. 1A to 1I are sectional views sequentially showing a conventional process of fabricating a flying tail type rigid-flexible PCB.
Figure 1B:
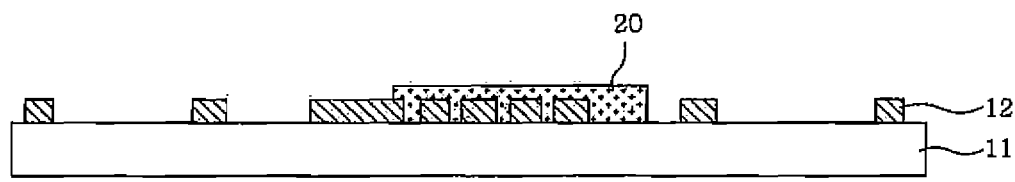
Figure 1C:
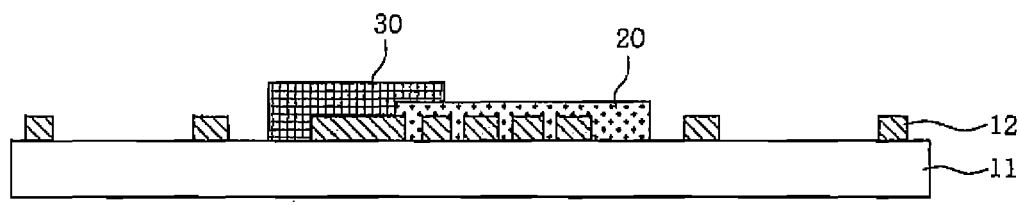
Figure 1D:
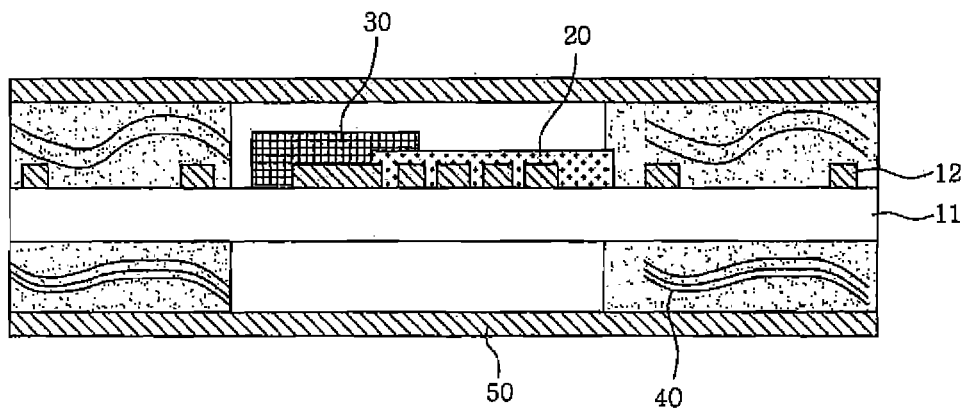
Figure 1E:
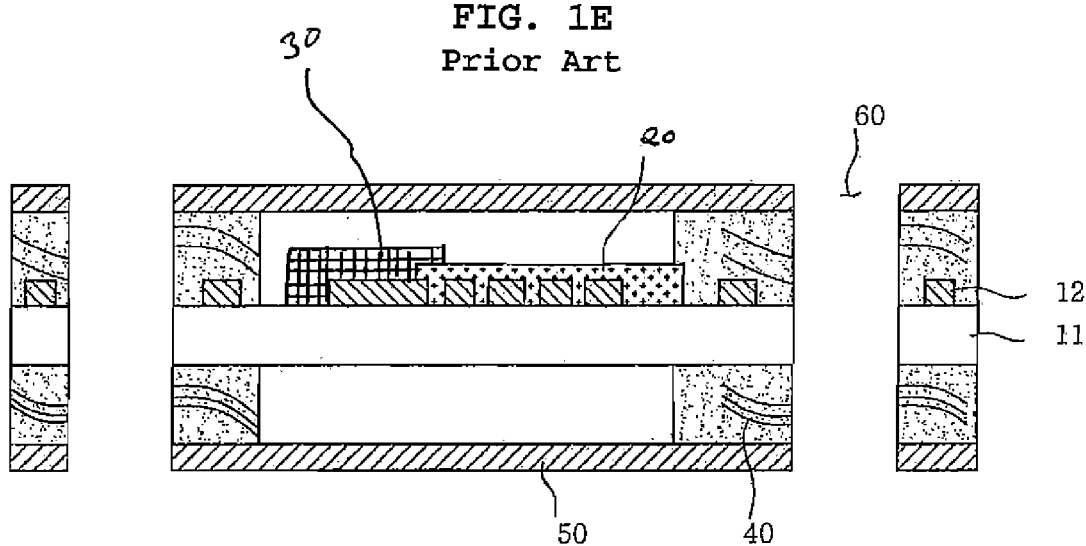
Figure 1F:
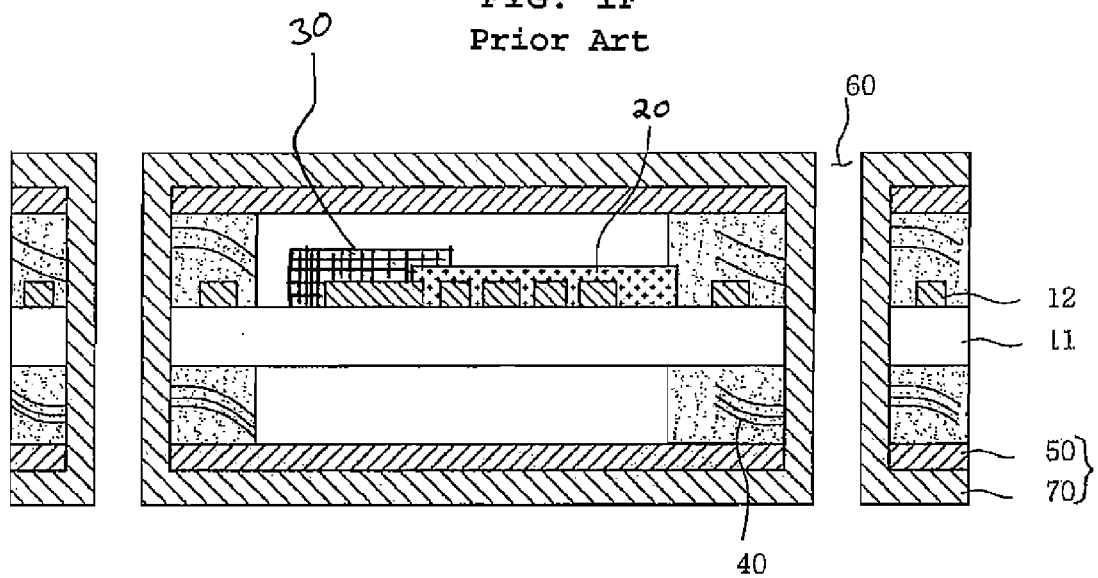
Figure 1G:
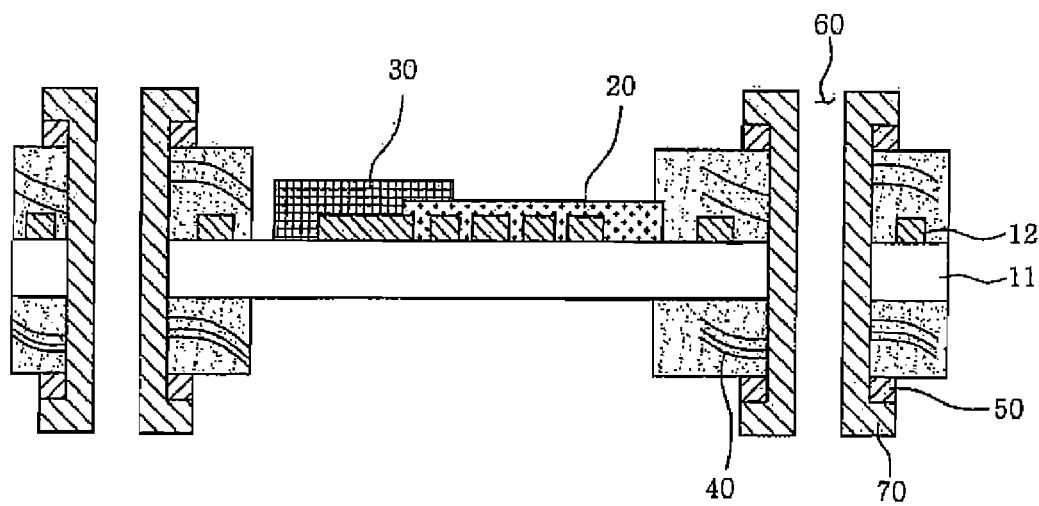
Figure 1H:
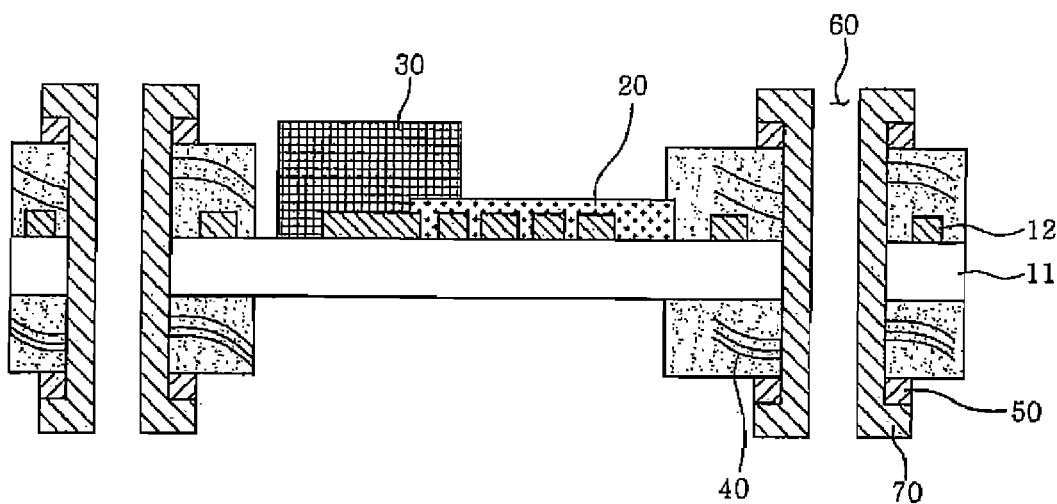
Figure 1I:
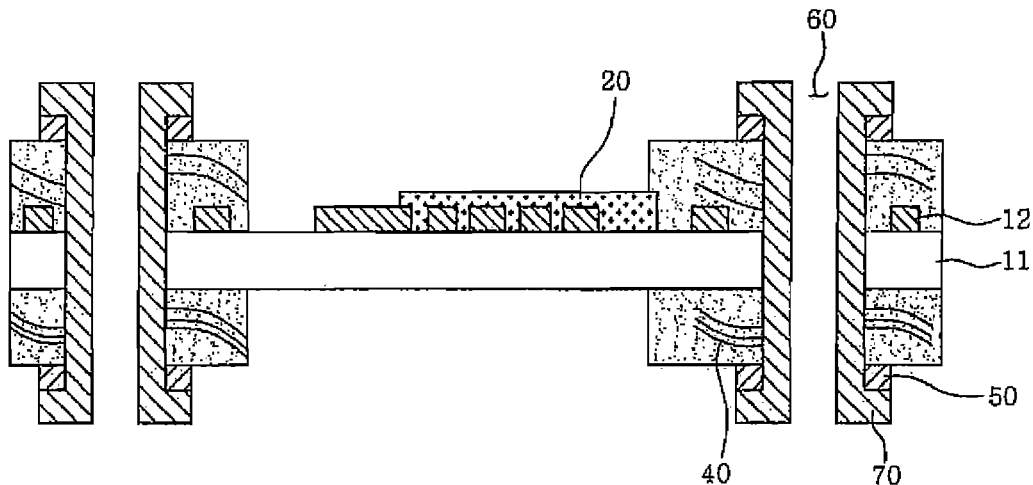
Figure 2A:
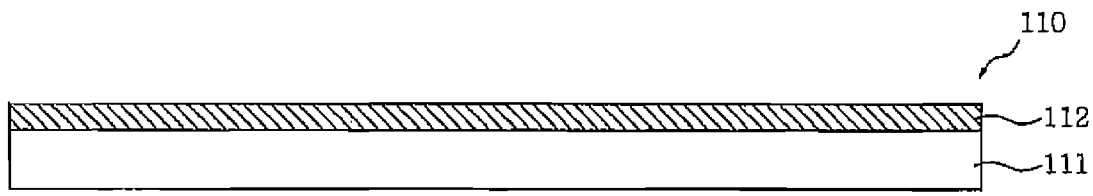
FIGS. 2A to 2I are sectional views sequentially showing a process of fabricating a rigid-flexible PCB, according to the present invention.

As shown in FIG. 2A, a polyimide copper clad laminate 110 comprising a polyimide layer 111 and a copper foil 112 is provided.

Polyimide is a polymer material suitable for working under conditions of high temperature and high pressure, thanks to its excellent wear resistance, heat resistance, self-lubricating ability, creep resistance, electrical insulating properties, and plasma properties in a vacuum.

Figure 2B:
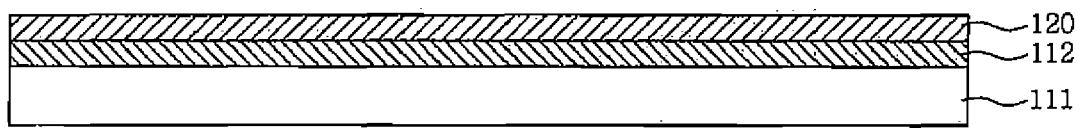

As shown in FIG. 2B, an etching resist pattern 120 for the formation of an internal circuit pattern is formed on the copper foil 112.

To form the etching resist pattern 120, a circuit pattern printed on an artwork film should be transferred onto the substrate. Although the transferring process may be variously conducted, it may be mainly carried out using a photosensitive dry film in such a manner that the circuit pattern printed on the artwork film is transferred onto the dry film using ultra violet (UV) light.

Figure 2C:

Thus, the dry film having the transferred circuit pattern may act as an etching resist. In the case where an etching process is performed using the dry film as an etching resist, the copper foil 112 in the region on which the etching resist pattern 120 is not formed, is removed, thus forming an internal circuit pattern having a predetermined shape, as shown in FIG. 2C.

Figure 2D:
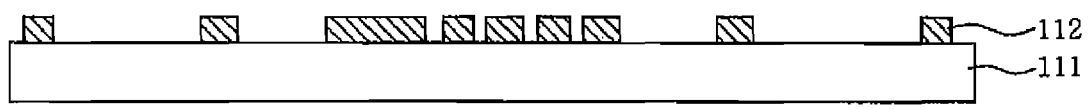

After the internal circuit pattern having a predetermined shape is formed, the etching resist pattern 120 remaining on the non-etched copper foil 112 is removed, thereby completing a base substrate, as shown in FIG. 2D.

Then, in order to protect the internal circuit pattern corresponding to a flexible region, which is to be formed on the base substrate, with the exception of a pad portion of the flexible region required for use in an external pad and a mounting pad, from external environments, a coverlay 130 is processed to suit the flexible region.

Figure 2E:
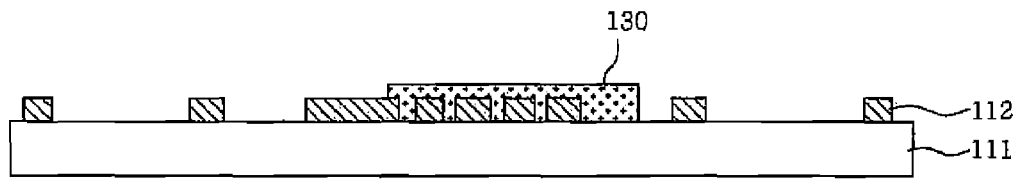

The coverlay 130 may be formed by attaching a polyimide film to the flexible region having the corresponding internal circuit pattern, with the exception of the pad portion of the flexible region, using an adhesive, and then temporarily bonding the polyimide film through manual soldering, as shown in FIG. 2E.

In the flexible region, the pad portion for use in an external pad and a mounting pad is exposed as not covered with the coverlay 130.

After the formation of the coverlay 130, prepregs 140 are placed on upper and lower surfaces of the base substrate corresponding to a rigid region, after which base copper plates 150 are placed on the prepregs 140 to correspond to the rigid and flexible regions.

Each of the prepregs 140 has a window corresponding to the flexible region such that the prepreg 140 is laminated only on the portion where the rigid region is formed. As such, the prepreg 140 is formed in a semi-cured state by infiltrating a thermosetting resin into glass fibers, and thus functions to confer mechanical strength to the rigid region and also may act as an adhesive between the base substrate and the base copper plate 150 upon the subsequent compression procedure.

The base copper plate 150 placed on the prepreg 140 does not have a window, to serve as the external circuit pattern of the rigid region and the protection plate of the pad portion of the flexible region.

Figure 2F:
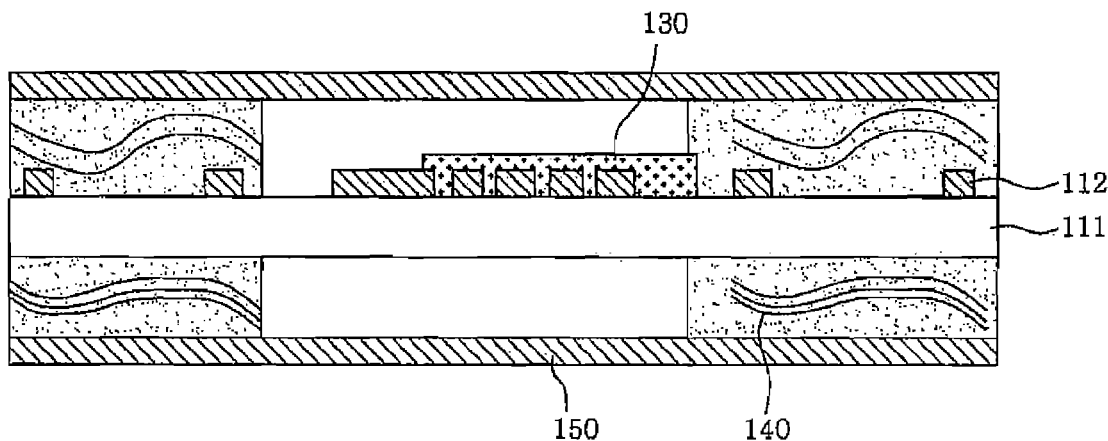

Thereafter, the base copper plate 150, the prepreg 140, the base substrate, the prepreg 140, and the base copper plate 150, in that order, are laminated and compressed under conditions of predetermined temperature and pressure, thereby forming both the rigid region, in which the internal circuit pattern 112 is incorporated into the prepreg 140, and the flexible region having the internal circuit pattern 112, part of which is coated with the coverlay 130, the other part of which is exposed to form the pad portion, as shown in FIG. 2F.

Figure 2G:
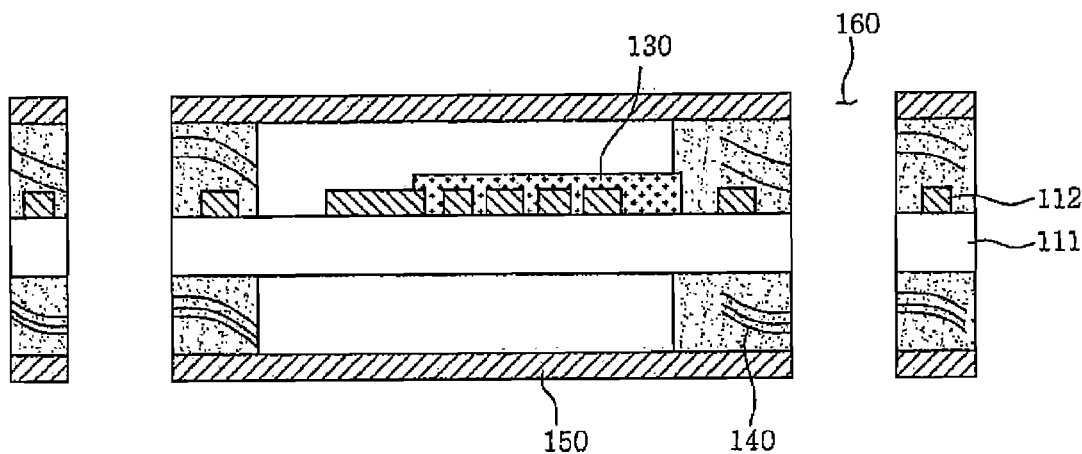

After the layers are compressed, a through hole 160 for electrical connection between internal and external layers of the substrate is formed, as shown in FIG. 2G.

The through hole 160 results from computer numerical control (CNC) drilling at the predetermined position of the rigid region, resulting in a plated through hole 160 penetrating through the substrate.

Figure 2H:
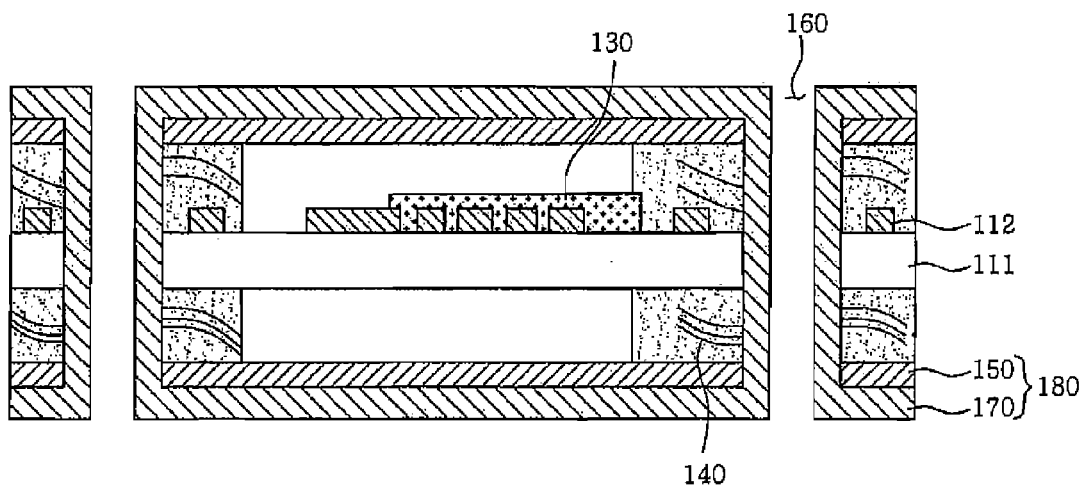

Thereafter, the through hole 160 and the base copper plate 150 are plated with copper, thus forming a copper plated layer 170, as shown in FIG. 2H.

The copper plated layer 170 formed on the through hole 160 acts to realize the electrical connection between the internal and external layers, while the copper plated layer 170 formed on the base copper plate 150, along with the base copper plate 150, constitutes a plated layer 180, which is then formed into an external circuit pattern.

Figure 2I:
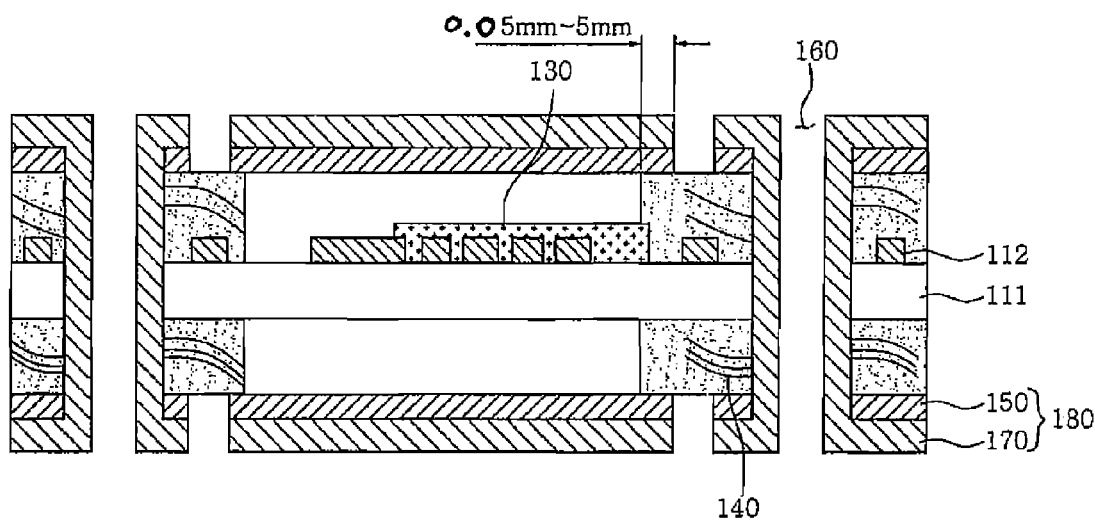

After the copper plated layer 170 is formed, a photolithographic process is conducted on the plated layer 180 using a dry film, to form a desired external circuit pattern, as shown in FIG. 2I.

As such, the external circuit pattern is formed only on the rigid region, so that the base copper plate 150 and the plated layer 180 corresponding to the flexible region function to protect the pad portion exposed for use in an external pad and a mounting pad. That is, when the external circuit pattern is formed, the flexible region should be protected by the base copper plate 150 and the plated layer 180 so that the exposed pad portion thereof is not damaged by the etching process.

In addition, for easy removal of the base copper plate 150 and the plated layer 180 corresponding to the flexible region, the base copper plate 150 and the plated layer 180 corresponding to the flexible region are formed to be about 0.05~5 mm larger than the flexible region. In addition, the edge portion of the base copper plate 150 and the plated layer 180 corresponding to the boundary between the flexible region and the rigid region is processed using a CNC drill or a steel rule die, whereby the subsequent removal procedure of the base copper plate 150 and the plated layer 180 becomes easier.

Figure 3:
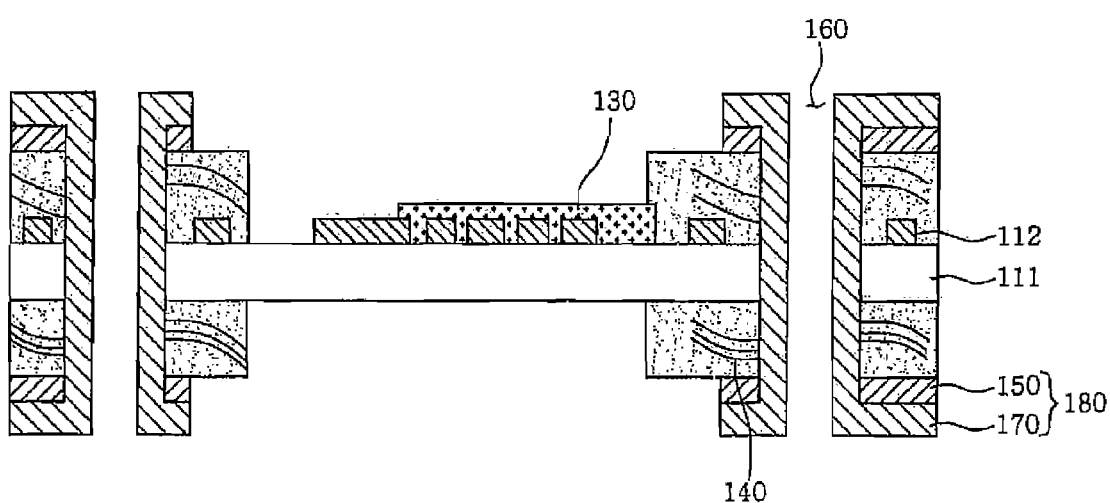
FIG. 3 is a sectional view showing the structure of the rigid-flexible PCB, fabricated using the method of the present invention.

Then, the base copper plate 150 and the plated layer 180 corresponding to the flexible region remaining to protect the exposed pad portion for use in an external pad and a mounting pad are physically removed by manual labor or using an automated machine. Further, with the goal of preventing a solder bridge phenomenon between external circuit patterns during a soldering process while protecting the external circuit pattern, the resultant substrate is coated with PSR ink and then surface treated. Thereby, as shown in FIG. 3, a flying tail type rigid-flexible PCB, without the need for a resist cover, is finally obtained.

As described above, the present invention provides a method of fabricating a rigid-flexible PCB. According to the method of the present invention, after an external circuit pattern is formed, the base copper foil of a flexible region is window etched to protect the exposed pad portion, instead of using a conventional resist cover formed of heat-resistant tape or peelable ink. Thereby, the inventive method is advantageous because the fabrication processes are simplified and price competitive power is increased.

In addition, since heat-resistant tape and peelable ink are not used in the present invention, conventional problems, that is, contamination and damage of the circuit pattern due to the presence of residue thereof, may be prevented, thus greatly increasing reliability.

The embodiment of the present invention has been disclosed for illustrative purposes, those skilled in the art will appreciate that various modifications, additions and substitutions are possible, without departing from the scope and spirit of the invention as disclosed in the accompanying claims.

What is claimed is:

1. A method of fabricating a rigid-flexible printed circuit board, comprising the steps of:
   providing a base substrate having a polyimide layer and an internal circuit pattern formed on at least one of an upper or a lower surface thereof;
   forming a coverlay, to protect the internal circuit pattern, on a corresponding flexible region of the base substrate that excludes a pad portion of the corresponding flexible region;
   placing prepregs on the upper and lower surfaces of the base substrate on a corresponding rigid region, placing base copper plates on the prepregs on the corresponding rigid region and the corresponding flexible region on the prepregs, and collectively laminating the placed prepregs and base copper plates to form a rigid region and a flexible region;
   forming external circuit patterns electrically connected to each other on the rigid region, while the base copper plate serves to protect the flexible region; and
   removing the base copper plate corresponding to the flexible region after the forming step has formed the external circuit patterns.

2. The method as set forth in claim 1, wherein the pad portion of the flexible region is a region for use in an external pad and a mounting pad.

3. The method as set forth in claim 1, wherein the base copper plate on the corresponding flexible region is formed to be about 0.05 to 5 mm larger than the flexible region.

4. The method as set forth in claim 1, wherein the removing step further comprises the steps of:
   processing a portion of the base copper plate corresponding to a boundary between the flexible region and the rigid region using a computer numerical control (CNC) drill or a steel rule die; and
   physically removing the base copper plate.

5. The method as set forth in claim 1, wherein the step of forming the external circuit patterns further comprises the steps of:
   forming a through hole through the rigid region;
   plating the base copper plate, on the corresponding rigid region having the through hole formed therethrough and the corresponding flexible region, with copper to form a plated layer; and
   partially removing the base copper plate and the plated layer on the corresponding rigid region to form the external circuit pattern, while the base copper plate serves to protect the flexible region.

* * * * *